United States Patent
Son

(10) Patent No.: US 8,299,493 B2
(45) Date of Patent: Oct. 30, 2012

(54) SEMICONDUCTOR LIGHT EMITTING DEVICE AND METHOD OF FABRICATING THE SAME

(75) Inventor: Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 298 days.

(21) Appl. No.: 12/676,785

(22) PCT Filed: Sep. 5, 2008

(86) PCT No.: PCT/KR2008/005266
§ 371 (c)(1),
(2), (4) Date: Mar. 5, 2010

(87) PCT Pub. No.: WO2009/031858
PCT Pub. Date: Mar. 12, 2009

(65) Prior Publication Data
US 2010/0252859 A1    Oct. 7, 2010

(30) Foreign Application Priority Data
Sep. 6, 2007   (KR) ........................ 10-2007-0090685

(51) Int. Cl.
*H01L 27/092* (2006.01)
*H01L 21/8238* (2006.01)
*H01L 21/336* (2006.01)

(52) U.S. Cl. ................. 257/103; 257/338; 257/E33.005; 257/E33.013

(58) Field of Classification Search ................. 257/338, 257/E21.632, E21.41, E27.062, E29.262, 257/103, E33.005, E33.013; 438/212, 46
See application file for complete search history.

(56) References Cited

U.S. PATENT DOCUMENTS

| 4,888,300 | A | * | 12/1989 | Burton ........................ 438/404 |
| 6,462,357 | B1 | | 10/2002 | Tsai et al. |
| 6,623,560 | B2 | | 9/2003 | Biwa et al. |
| 7,479,661 | B2 | | 1/2009 | Lee et al. |
| 2007/0080352 | A1 | | 4/2007 | Wu et al. |

FOREIGN PATENT DOCUMENTS

| JP | 2000-101135 A | 4/2000 |
| JP | 2002-033288 A | 1/2002 |
| JP | 2002-170991 A | 6/2002 |
| JP | 2006-096620 A | 4/2006 |
| JP | 2006-237254 A | 9/2006 |
| JP | 2006-324669 A | 11/2006 |
| JP | 2007-103898 A | 4/2007 |
| KR | 10-0700529 B1 | 3/2007 |
| TW | 200705706 A | 2/2007 |
| WO | WO 2006/068377 A1 | 6/2006 |

\* cited by examiner

*Primary Examiner* — David S Blum

(74) *Attorney, Agent, or Firm* — Birch, Stewart, Kolasch & Birch, LLP

(57) ABSTRACT

Provided are a semiconductor light emitting device and a method of fabricating the same. The semiconductor light emitting device includes a first conductive type semiconductor layer, an active layer, and a second conductive type semiconductor layer. The first conductive type semiconductor layer includes an insulation layer including protrusions having a predetermined interval and a void between the protrusions of the insulation layer. The active layer is disposed on the first conductive type semiconductor layer. The second conductive type semiconductor layer is disposed on the active layer.

20 Claims, 3 Drawing Sheets

[Fig. 1]
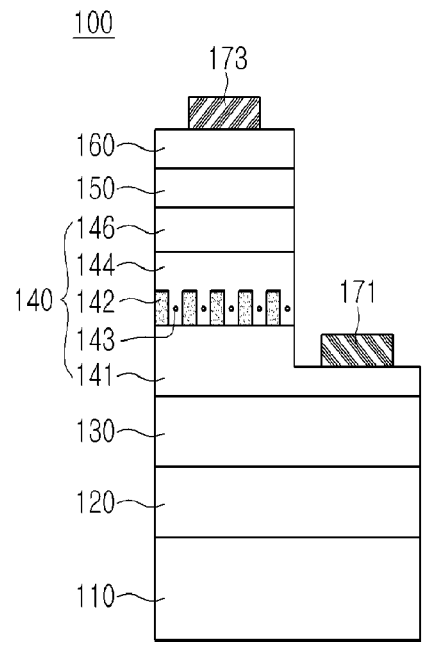
[Fig. 2]
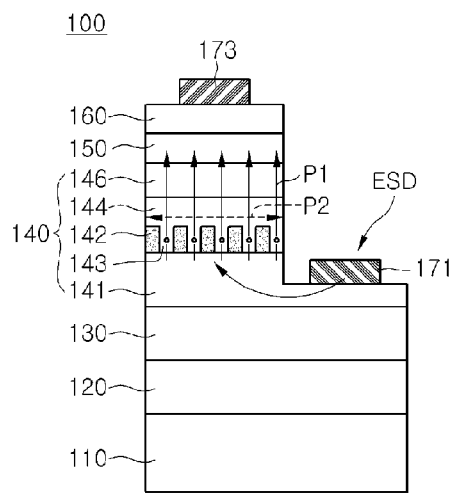
[Fig. 3]
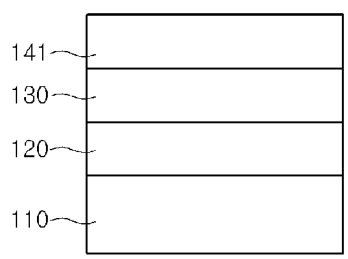

[Fig. 4]
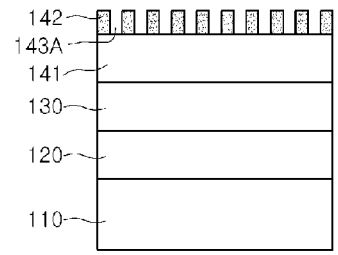
[Fig. 5]
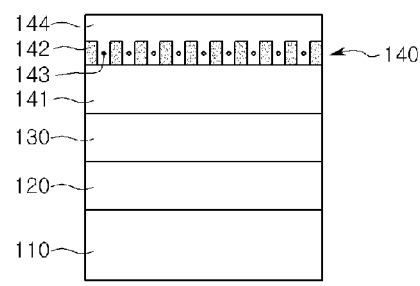
[Fig. 6]
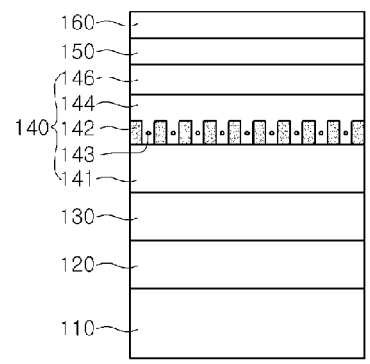
[Fig. 7]
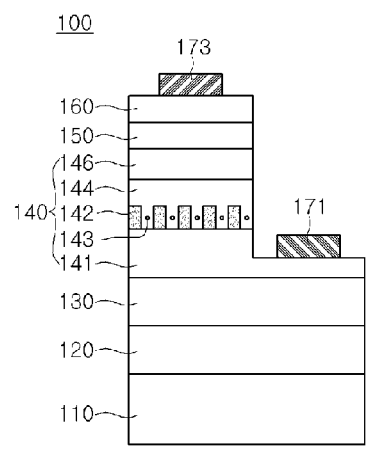

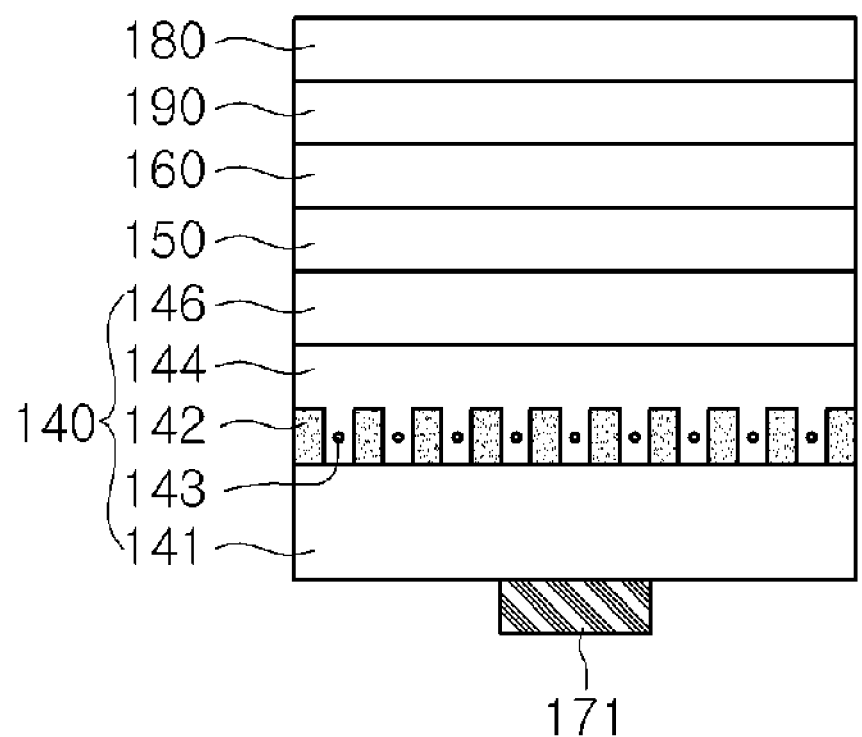
[Fig. 8]

SEMICONDUCTOR LIGHT EMITTING DEVICE AND METHOD OF FABRICATING THE SAME

TECHNICAL FIELD

Embodiments relate to a semiconductor light emitting device and a method of fabricating the same.

BACKGROUND ART

A III-V group nitride semiconductor has been variously used for an optical device such as blue/green light emitting diodes (LEDs), a high speed switching device such as a metal semiconductor field effect transistor (MOSFET) and a hetero junction filed effect transistor (HEMT), a light source of an illumination or a display apparatus, and the like. In particular, a light emitting device using an III group nitride semiconductor has a direct transition-type bandgap corresponding to the range of visible rays to ultraviolet rays, and can perform high efficient light emission.

The nitride semiconductor has been mainly utilized as a LED or a laser diode (LD), and research for improving the manufacturing process or light efficiency has been conducted.

DISCLOSURE OF INVENTION

Technical Problem

Embodiments provide a semiconductor light emitting device comprising a conductive type semiconductor layer comprising an insulation layers or voids, and a method of fabricating the same.

Embodiments provide a semiconductor light emitting device comprising a first conductive type semiconductor layer comprising an insulation layers and a voids, and a method of fabricating the same.

Technical Solution

An embodiment provides a semiconductor light emitting device comprising: a first conductive type semiconductor layer comprising an insulation layers comprising a pre-determined interval and a voids between the insulation layers; an active layer on the first conductive type semiconductor layer; and a second conductive type semi-conductor layer on the active layer.

An embodiment provides a semiconductor light emitting device comprising: a first conductive type semiconductor layer comprising a first nitride layer formed with a first electrode layer and a second nitride layer comprising a voids; an active layer on the second nitride layer; and a second conductive type semiconductor layer on the active layer.

An embodiment provides a method of fabricating a semiconductor light emitting device comprising: forming a first conductive type semiconductor layer comprising an insulation layers and a voids between the insulation layers therein; forming an active layer on the first conductive type semiconductor layer; and forming a second conductive type semiconductor layer on the active layer.

ADVANTAGEOUS EFFECTS

Embodiments can improve electrostatic discharge (ESD) characteristics.

Embodiments can reduce dislocation density due to insulation layers and voids of a first conductive type semiconductor layer.

Embodiments can minimize damage of an active layer.

Embodiments can improve internal quantum efficiency because a first conductive type semiconductor layer uniformly distributes a current injected into an active layer.

Embodiments can improve reliability of a semiconductor light emitting device.

BRIEF DESCRIPTION OF THE DRAWINGS

FIG. 1 is a side cross-sectional view of a semiconductor light emitting device according to a first embodiment.

FIG. 2 is a view of current distribution when an electrostatic discharge (ESD) voltage is applied to the semiconductor light emitting device of FIG. 1.

FIGS. 3 to 7 are side cross-sectional views illustrating a process of fabricating the semiconductor light emitting device according to a first embodiment.

FIG. 8 is a side cross-sectional view of a semiconductor light emitting device according to a second embodiment.

MODE FOR THE INVENTION

Hereinafter, a semiconductor light emitting device and a method of fabricating the same according to embodiments will be described in detail with reference to the accompanying drawings. In the following description, when a layer (or film) is referred to as being on or under another layer, its description will be made with reference to the accompanying drawings. The thickness of each layer may be described as one example, and is not limited to the thicknesses of the accompanying drawings.

FIG. 1 is a side cross-sectional view of a semiconductor light emitting device according to a first embodiment.

Referring to FIG. 1, a semiconductor light emitting device 100 comprises a substrate 110, a buffer layer 120, an undoped semiconductor layer 130, a first conductive type semiconductor layer 140 comprising an insulation layers 142 and a voids 143, an active layer 150, a second conductive type semiconductor layer 160, a first electrode layer 171, and a second electrode layer 173.

The substrate 110 may be formed of at least one of sapphire ($Al_2O_3$), SiC, Si, GaAs, GaN, ZnO, GaP, InP, and Ge. Also, the substrate 110 may be formed of a material having conductive characteristics. Uneven patterns may be disposed on and/or under the substrate 110. Each of the uneven patterns may have one of stripe, lens, cylindrical, and cone shapes, but are not limited thereto.

A nitride semiconductor is grown on the substrate 110. An E-beam evaporator, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus may be used as growth equipment, but not limited to the apparatuses.

The buffer layer 120 is disposed on the substrate 110. The undoped semiconductor layer 130 is disposed on the buffer layer 120. The buffer layer 120 acts as a layer decreasing a lattice constant difference between the substrate 110 and GaN material. The undoped semiconductor layer 130 comprises an undoped GaN layer and acts as a substrates on which the nitride semiconductor is grown. Only one of the buffer layer 120 and the undoped semiconductor layer 130 may be disposed on the substrate 110, or all two layers of the buffer layer 120 and the undoped semiconductor layer 130 may not be disposed on the substrate 110.

The first conductive type semiconductor layer 140 is disposed on the undoped semiconductor layer 130. For example, the first conductive type semiconductor layer 140 may be realized with an n-type semiconductor layer doped with n-type dopants. The n-type semiconductor layer may be formed of one of semiconductor materials having a composition formula expressed by $In_yAl_xGa_{1-x-y}N$ ($0 \leq x \leq 1$, $0 \leq y \leq 1$, $0 \leq x+y \leq 1$), e.g., InAlGaN, GaN, AlGaN, InGaN, AlN, and InN. The n-type dopants may comprise Si, Ge, Sn, Se, and Te.

The first conductive type semiconductor layer 140 comprises a first nitride layer 141, the insulation layers 142, the voids 143, a second nitride layer 144, and a third nitride layer 146.

The first to third nitride layers 141, 144, and 146 may be realized with the n-type semiconductor layer doped with the n-type dopants.

The first nitride layer 141 is disposed on the undoped semiconductor layer 130, and the first electrode layer 171 is disposed on one side thereof. The first nitride layer 141 may be formed of one of InAlGaN, GaN, AlGaN, InGaN, AlN, and InN, and defined as a first electrode contact layer.

The insulation layers 142 are disposed on the first nitride layer 141. Each of the insulation layers 142 may have a protrusion shape having insulation characteristics. The insulation layers 142 may be realized with MgN layers. The MgN layers may have a random size and shape and irregular intervals.

Also, the insulation layers 142 may comprise a nitride semiconductor having the insulation characteristics. The nitride semiconductor having the insulation characteristics may be realized with a nitride semiconductor doped with p-type dopants and the n-type dopants, for example, may be formed of one of GaN, AlGaN, InGaN, and InAlGaN. The p-type dopants comprise Mg, Zn, Ca, Sr, and Ba, and the n-type dopants comprise Si, Ge, Sn, Se, and Te.

Each of the insulation layers 142 has a predetermined thickness, e.g., a thickness ranging from about 0.0001 μm to about 1 μm on a surface of the first nitride layer 141. A pitch between a protrusion and an adjacent protrusion of the insulation layers 142 may be in the range of about 10 Å to 3 μm.

Since the insulation layers 142 are spaced a predetermined distance from each other on the first nitride layer 141, the insulation layers 142 partially block an electrostatic discharge (ESD) voltage applied through the first nitride layer 141.

The second nitride layer 144 is disposed on the insulation layers 142. The second nitride layer 144 may comprise a semiconductor layer formed of GaN, for example, may be formed of one of InAlGaN, GaN, AlGaN, and InGaN. Preferably, the second nitride layer 144 may be formed of GaN.

The second nitride layer 144 comprises voids 143 disposed between the insulation layers 142. The voids 143 may be disposed between the insulation layers 142, within the second nitride layer 144, or between the first nitride layer 141 and the second nitride layer 144. Here, the voids 143 may be disposed between some or all protrusions of the insulation layers 142.

The second nitride layer 144 acts as a bridge layer receiving a voltage of the first nitride layer 141. The second nitride layer 144 may act as a low defect layer having a dislocation lower than that of the first nitride layer 141. The low defect layer diffuses current into a whole layer.

Since the insulation layers 142 are disposed on the first nitride layer 141, regions (comprising void regions) between the insulation layers 142 may act as a seed layer of the second nitride layer 144.

Since the insulation layers 142 and the voids 143 block the dislocation existing within the first nitride layer 141, dislocation density of the second nitride layer 144 may be less than that of the first nitride layer 141. Since the dislocation density of the second nitride layer 144 is reduced, ESD resistance may be improved.

The insulation layers 142 and the voids 143 may be disposed between the layer 141 on which the first electrode layer 171 is disposed and the active layer 150.

The third nitride layer 146 is disposed on the second nitride layer 144. The third nitride layer 146 may be formed of one of InAlGaN, GaN, AlGaN, InGaN, AlN, and InN.

The active layer 150 is disposed on the third nitride layer 146. The active layer 150 may comprise a single quantum well structure or a multi quantum well structure. A conductive type clad layer (not shown) may be disposed on and/or under the active layer 150. The conductive type clad layer may be realized with an AlGaN layer.

The second conductive type semiconductor layer 160 is disposed on the active layer 150. The second conductive type semiconductor layer 160 may be realized with a p-type semiconductor layer doped with the p-type dopants. The p-type semiconductor layer may be formed of one of semiconductor materials having a composition formula expressed by $In_yAl_xGa_{1-x-y}N$ ($0 \leq x \leq 1$, $0 \leq y \leq 1$, $0 \leq x+y \leq 1$), e.g., InAlGaN, GaN, AlGaN, InGaN, AlN, and InN. The p-type dopants may comprise Mg, Zn, Ca, Sr, and Ba.

The second electrode layer 173 is disposed on the second conductive type semiconductor layer 160. A third conductive type semiconductor layer (not shown) and/or a transparent electrode layer (not shown) may be disposed between the second conductive type semiconductor layer 160 and the second electrode layer 173. The third conductive type semiconductor layer may be realized with the n-type semiconductor layer or the p-type semiconductor layer according to an n-p-n junction structure or a p-n-p junction structure.

FIG. 2 is a view of current distribution when an ESD voltage is applied to the semiconductor light emitting device of FIG. 1.

Referring to FIG. 2, an ESD voltage may be applied to the first electrode layer 171 of the semiconductor light emitting device 100. The ESD voltage applied to the first electrode layer 171 is voltage-dropped and dispersed by the first conductive type semi-conductor layer 140 to transmit the voltage-dropped and dispersed voltage into the active layer 150.

The insulation layers 142 of the first conductive type semiconductor layer 140 block the ESD voltage. The blocked ESD voltage moves into a position at which the insulation layers 142 are not disposed, i.e., a position at which the voids are disposed. That is, the ESD voltage dispersedly moves into the position at which the voids are disposed by the insulation layers 142 within the first nitride layer 141.

The ESD voltage is transmitted to the second nitride layer 144 through the voids 143 disposed between the insulation layers 142. Here, the ESD voltage passes through the voids 143 using a tunneling effect. The ESD voltage passing through the voids 143 is voltage-dropped. That is, the ESD voltage transmitted to the second nitride layer 144 is lower than an initial applied voltage. The tunneling effect is in inverse proportion to a depth (i.e., height) of each of the voids 143 and in proportion to a width of each of the voids 143.

The insulation layers 142 partially block an ESD voltage of the first nitride layer 141 to horizontally disperse the ESD voltage. The voids 143 transmit the ESD voltage to the second nitride layer 144 through a vertical channel P1. Here, the ESD voltage is primarily dropped by the tunneling effect of the voids 143.

Since the second nitride layer 144 acts as the low defect layer, the second nitride layer 144 can horizontally disperse the ESD voltage transmitted through the voids 143.

The first conductive type semiconductor layer 140 partially blocks, voltage-drops, and disperses the ESD voltage applied to the first electrode layer 171 to transmit the ESC voltage to the active layer 150. The semiconductor light emitting device 100 has resistance against a high-voltage such as the ESD voltage applied to the first electrode layer 171. Also, damage of the active layer 150 due to the ESD voltage can be minimized.

Since the first conductive type semiconductor layer 140 disperses a forward current to transmit the dispersed current to the active layer 150, internal quantum efficiency can be improved.

FIGS. 3 to 7 are side cross-sectional views illustrating a process of fabricating the semiconductor light emitting device according to a first embodiment.

Referring to FIG. 3, a buffer layer 120, an undoped semiconductor layer 130 and a first nitride layer 141 of a first conductive type semiconductor layer 141 are sequentially formed on a substrate 110.

The substrate 110 may be formed of at least one of sapphire ($Al_2O_3$), SiC, Si, GaAs, GaN, ZnO, GaP, InP, and Ge.

The buffer layer 120 acts as a layer decreasing a lattice constant difference between the substrate 110 and the undoped semiconductor layer 130, and may be formed of one of GaN, AlN, AlGaN, and InGaN.

The undoped semiconductor layer 130 may be realized with an undoped GaN layer on the buffer layer 120 or the substrate 110. Only one of the buffer layer 120 and the undoped semiconductor layer 130 may be formed on the substrate 110, or none of them may be formed on the substrate 110.

The first nitride layer 141 of the first conductive type semiconductor layer is formed on the undoped semiconductor layer 130. For example, in a growth method of the first nitride layer 141, a silane gas comprising an n-type dopants such as $NH_2$, TMGa (or TEGa), and Si is supplied to form a GaN layer having a predetermined thickness. Here, the first nitride layer 141 may be formed of one of InAlGaN, AlGaN, InGaN, AlN, and InN instead of GaN.

Referring to FIG. 4, the insulation layers 142 are formed on the first nitride layer 141. Each of the insulation layers 142 are formed with a random protrusion shape and have irregular intervals relative to each other.

Recesses 143A are formed between the insulation layers 142. The insulation layers 142 act as a voltage blocking layer, and may be formed of a material having insulation characteristics, e.g., MgN. In a growth method of the MgN insulation layers 142, for example, $H_2$ atmosphere gas and $NH_3$ source gas are supplied with a predetermined amount (e.g., $H_2$:100 slpm, $NH_3$:30 slpm), and then, Cp2Mg source gas flows for a pre-determined time interval (e.g., about five minutes) and with a predetermined amount (e.g., about 1-2 μmol) in a state where the $H_2$ atmosphere gas is not supplied to form the MgN layers having the random protrusion shape on the first nitride layer 141.

The insulation layers 142 may comprise a nitride semiconductor doped with the n-type dopants and p-type dopants. For example, the insulation layers 142 may comprise a GaN layer co-doped with Mg—Si.

Referring to FIG. 5, the second nitride layer 144 is formed on the insulation layers 141. The second nitride layer 144 is formed on the insulation layers 141 and the first nitride layer 141, and voids 143 are formed between the insulation layers 142. A surface of the second nitride layer 144 may have an uneven shape or a flat shape.

For example, in a growth method of the second nitride layer 144, the silane gas comprising the n-type dopants such as $NH_2$, TMGa (or TEGa), and Si is supplied to form a GaN layer having a predetermined thickness. Here, the amount of TMGa gas supplied to the second nitride layer 144 is more than the amount of TMGa gas supplied to the first nitride layer 141. Thus, the second nitride layer 144 grows actively in a vertical direction such that the recesses (reference numeral 143A of FIG. 4) between the insulation layers 142 exist in a state of voids 143 having a predetermined size. That is, when the second nitride layer 144 is grown, a size of each of the voids 143 between the insulation layers 142 can be adjusted by adjusting the Ga source gas (i.e., TMGa).

Since the second nitride layer 144 has a growth condition different from that of the first nitride layer 141, a dislocation existing on a bounday between the two layers 141 and 144 is not propagated, but horizontally progressed. As a result, the dislocation is reduced or eliminated. Thus, threading dislocation of the second nitride layer 144 is bended or removed, and thus, grown as a low defect layer, thereby increasing resistance against the voltage.

A doping density of the n-type dopants of the second nitride layer 144 is $(1~9.9)\times10^{17}/cm^3$, and hole mobility is greater than about 500 $cm^2/Vs$.

Here, the insulation layers 142 partially block a voltage transmitted from the first nitride layer 141 to the second nitride layer 144. The second nitride layer 144 disperses a voltage applied to the first nitride layer 141, and then, transmits the dispersed voltage to the third nitride layer 146.

The voids 143 drop high-voltage such as an EDS voltage applied to the first nitride layer 141 using a tunneling effect to transmit the dropped voltage to the second nitride layer 144. The tunneling effect is in inverse proportion to a depth of each of the voids 143 and in proportion to a width of each of the voids 143.

The second nitride layer 144 may have the growth condition different from those/that of the first nitride layer 141 and/or the third nitride layer 146. The insulation layers 142 and the voids 143 are formed on the first nitride layer 141, i.e., an electrode contact layer.

Referring to FIG. 6, the third nitride layer 146 is formed on the second nitride layer 144. For example, in a growth method of the third nitride layer 146, the silane gas comprising the n-type dopants such as $NH_2$, TMGa (or TEGa), and Si is supplied to form a GaN layer having a predetermined thickness.

The first conductive type semiconductor layer 140 comprises the first nitride layer 141, the insulation layers 142, the second nitride layer 144 and the third nitride layer 146. Also, the first conductive type semiconductor layer 140 blocks, voltage-drops, and disperses the ESD voltage. That is, resistance against an ESD reverse voltage of the semiconductor light emitting device can be improved.

An active layer 150 is formed on the third nitride layer 146 of the first conductive type semiconductor layer 140. A second conductive type semiconductor layer 160 is formed on the active layer 150. A third conductive type semiconductor layer (not shown) and/or a transparent electrode layer (not shown) may be formed on the second conductive type semiconductor layer 160. The third conductive type semiconductor layer may be realized with the n-type semiconductor layer.

The active layer 150 may comprise a single quantum well structure or a multi quantum well structure. A conductive type clad layer (not shown) may be formed on and/or under the active layer 150. The conductive type clad layer may be realized with an AlGaN layer.

The second conductive type semiconductor layer 160 may be realized with a p-type semiconductor layer doped with the p-type dopants. The p-type semiconductor layer may be formed of one of semiconductor materials having a composition formula expressed by $In_yAl_xGa_{1-x-y}N$ ($0 \leq x \leq 1$, $0 \leq y \leq 1$, $0 \leq x+y \leq 1$), e.g., InAlGaN, GaN, AlGaN, InGaN, AlN, and InN. The p-type dopants may comprise Mg, Zn, Ca, Sr, and Ba.

Referring to FIG. 7, a mesa etching process is performed on a portion of the second conductive type semiconductor layer 160 to expose the first nitride layer 141 of the first conductive type semiconductor layer 140. A first electrode layer 171 is formed on the first nitride layer 141, and a second electrode layer 173 is formed on the second conductive type semiconductor layer 160.

FIG. 8 is a side cross-sectional view of a semiconductor light emitting device according to a second embodiment. In the following description of the second embodiment, duplicate description for elements which are the same as those of the first embodiment will be omitted.

Referring to FIG. 8, a semiconductor light emitting device 100A comprises a first conductive type semiconductor layer 140 comprising an insulation layers 142 and a voids 143, an active layer 150, a second conductive type semiconductor layer 160, a reflective electrode layer 180, and a conductive support substrate 190.

The reflective electrode layer 180 is disposed on the second conductive type semiconductor layer 160, and the conductive support substrate 190 is disposed on the reflective electrode layer 180.

Here, the reflective electrode layer 180 serves as a p-type electrode, and the p-type electrode becomes an ohmic contact in order to stably supply current to the second conductive type semiconductor layer 160. Here, the reflective electrode layer 180 may be formed of a single layer or a multilayer having one of Ag, Ni, Al, Rh, Pd, Ir, Ru, Mg, Zn, Pt, Au, Hf, and a combination thereof. The conductive support substrate 190 may be formed of copper or gold. Materials of the reflective electrode layer 180 and the conductive support substrate 190 may vary and are not limited to the above materials.

A first electrode 171 is disposed under the first conductive type semiconductor layer 140. Since the conductive support substrate 190 and the reflective electrode layer 180 serve as a second electrode, a vertical type semiconductor light emitting device can be realized.

Referring to FIG. 6, the substrate 110 disposed under the first conductive type semiconductor layer 140, the buffer layer 120, and the undoped semiconductor layer 130 are removed using a physical and/or chemical removing method. For example, the removing method of the substrate 110 may be performed through a laser lift off (LLO) method. That is, when a laser of a predetermined wavelength is projected on the substrate 110, heat energy is concentrated on the boundary between the substrate 110 and the first conductive type semiconductor layer 140, and the substrate 110 separates from the first conductive type semiconductor layer 140.

Here, the buffer layer 120 or/and the undoped semiconductor layer 130 disposed between the substrate 110 and the first conductive type semiconductor layer 140 can be separated from the substrate 110 by injecting a wet etchant.

A polishing process may be performed using an Inductively coupled Plasma/Reactive Ion Etching (ICP/RCE) method on the bottom of the first conductive type semiconductor layer 140 in which the substrate 110 is removed.

The first electrode layer 171 is disposed under the first conductive type semiconductor layer 140. When the ESD voltage is applied to the first electrode layer 171, the ESD voltage is partially blocked by the insulation layers 142 in the first nitride layer 141 of the first conductive type semiconductor layer 140, tunneled through the voids 143, and dispersed by the second nitride layer 144. Therefore, the first conductive type semiconductor layer 140 can disperse and drop the ESD voltage to transmit the ESD voltage to the active layer 150, thereby minimizing damage of the active layer 150.

The embodiments of the present invention can be realized with one of a p-n structure, an n-p structure, an n-p-n structure, and a p-n-p structure. In the description of embodiments, it will be understood that when a layer (or film), region, pattern or structure is referred to as being 'on' or 'under' another layer (or film), region, pad or pattern, the terminology of 'on' and 'under' comprises both the meanings of 'directly on/under' and 'indirectly on/under'. Further, the reference about 'on' and 'under' each layer will be made on the basis of drawings. Also, the thickness of each layer in the drawings is an example, and is not limited thereto.

Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. Thus, it is intended that the present invention covers the modifications and variations of this invention provided they come within the scope of the appended claims and their equivalents.

Industrial Applicability

Embodiment can provide a semiconductor light emitting device.

Embodiment can provide a semiconductor light emitting device variously applicable to a high speed switching device, a lighting, or a light source of a display device.

Embodiment can improve reliability of a semiconductor light emitting device.

The invention claimed is:

1. A semiconductor light emitting device, comprising:
a first conductive type semiconductor layer comprising a first semiconductor layer and a second semiconductor layer on the first semiconductor layer;
an insulation layer between the first semiconductor layer and the second semiconductor layer, the insulation layer having a recess;
an active layer on the first conductive type semiconductor layer; and
a second conductive type semiconductor layer on the active layer,
wherein a portion of the first conductive type semiconductor layer is disposed in the recess.

2. The semiconductor light emitting device according to claim 1, wherein the insulation layer comprises a MgN layer.

3. The semiconductor light emitting device according to claim 1, wherein the insulation layer comprises a nitride semiconductor doped with n-type dopants and p-type dopants.

4. The semiconductor light emitting device according to claim 1, further comprising:
a first electrode layer on the first semiconductor layer; and a second electrode layer connected to the second semiconductor layer.

5. The semiconductor light emitting device according to claim 1, wherein a dislocation density of the second semiconductor layer is less than that of the first semiconductor layer.

6. The semiconductor light emitting device according to claim 1,
wherein the recess comprises a plurality of recesses spaced apart from each other in the insulation layer, and
wherein the portion of the first conductive type semiconductor layer comprises a plurality of portions disposed in the plurality of recesses, respectively.

7. The semiconductor light emitting device according to claim 6, further comprising:
a void in at least one of the plurality of portions.

8. The semiconductor light emitting device according to claim 7, wherein the void comprises a plurality of voids disposed in the plurality of portions, respectively.

9. The semiconductor light emitting device according to claim 7, wherein the insulation layer has a thickness ranging from about 0.0001 μm to about 1 μm.

10. The semiconductor light emitting device according to claim 1, wherein at least one of the first conductive type semiconductor layer and the insulation layer includes a nitride-based material.

11. A semiconductor light emitting device, comprising:
a first conductive type semiconductor layer comprising a first semiconductor layer and a second semiconductor layer on the first semiconductor layer, the second semiconductor layer comprising a void;
an active layer on the second semiconductor layer;
a second conductive type semiconductor layer on the active layer; and
a first electrode layer physically contacted with the first semiconductor layer,
wherein the second semiconductor layer includes a plurality of portions spaced apart from each other, and
wherein the void is disposed in at least one of the plurality of portions.

12. The semiconductor light emitting device according to claim 11, further comprising:
an insulation layer including a plurality of recesses having a predetermined interval, the insulation layer located between the second semiconductor layer and the first semiconductor layer,
wherein the plurality of portions of the second semiconductor layer are disposed in the plurality of the recesses of the insulation layer, respectively.

13. The semiconductor light emitting device according to claim 11, further comprising:
a third semiconductor layer between the second semiconductor layer and the active layer,
wherein at least one of the first to third semiconductor layers comprises an n-type semiconductor layer.

14. The semiconductor light emitting device according to claim 12,
wherein the insulation layer comprises a MgN layer, and
wherein the MgN layer has a thickness ranging from about 0.0001 μm to about 1 μm.

15. The semiconductor light emitting device according to claim 11, wherein the plurality of portions is physically contacted with the first semiconductor layer.

16. The semiconductor light emitting device according to claim 11, wherein at least one of the first conductive type semiconductor layer and the insulation layer is a nitride-based layer.

17. The semiconductor light emitting device according to claim 11, wherein at least one of the first conductive type semiconductor layer and the insulation layer includes a nitride-based material.

18. A semiconductor light emitting device, comprising:
a first conductive type semiconductor layer comprising a plurality of semiconductor layers;
a second conductive type semiconductor layer on the first conducive type semiconductor layer;
an active layer between the first conductive type semiconductor layer and the second conductive type semiconductor layer;
an insulation layer between the plurality of semiconductor layers, the insulation layer including a plurality of first protrusions; and
a plurality of recesses between the plurality of first protrusions,
wherein the first conductive type semiconductor layer includes a plurality of second protrusions located in the plurality of recesses.

19. The semiconductor light emitting device according to claim 18, further comprising:
a void in at least one of the plurality of second protrusions,
wherein the plurality of second protrusions has a pitch ranging from about 10 Å to about 3 μm.

20. The semiconductor light emitting device according to claim 18, wherein the insulation layer is formed of a different material from the plurality of semiconductor layers.

* * * * *